Figure 1:
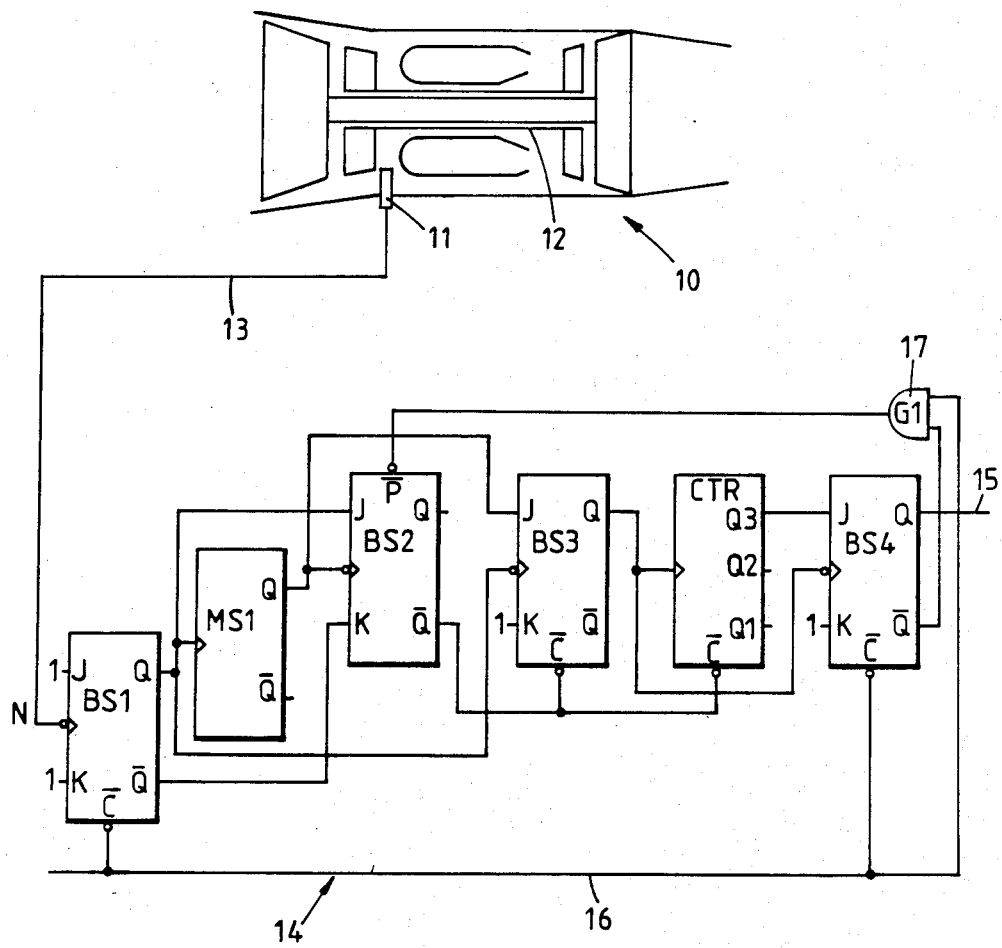

United States Patent [19]

Plant

[11] Patent Number: 4,882,545
[45] Date of Patent: Nov. 21, 1989

[54] CIRCUIT ARRANGEMENT FOR DETECTING A CRITICAL FREQUENCY OF INPUT PULSES

[75] Inventor: Anthony B. Plant, Birmingham, England

[73] Assignee: Lucas Industries Public Limited Company, Birmingham, England

[21] Appl. No.: 153,069

[22] Filed: Feb. 8, 1988

[30] Foreign Application Priority Data

Feb. 26, 1987 [GB] United Kingdom ............... 8704499

[51] Int. Cl.$^4$ .................... H03K 9/06; H03D 3/60
[52] U.S. Cl. .................... 328/138; 328/141; 307/522; 377/28
[58] Field of Search .................... 328/138, 140, 141; 377/28; 307/523, 522, 271, 273

[56] References Cited

U.S. PATENT DOCUMENTS

| | | | |
|---|---|---|---|
| 3,500,375 | 3/1970 | Klimo | 328/138 |
| 3,943,382 | 3/1976 | Hermansdorfer et al. | 328/138 |
| 4,211,982 | 7/1980 | Smith | 328/140 |
| 4,353,091 | 10/1982 | Hoppe | 307/522 |
| 4,360,782 | 11/1982 | Nowell | 328/138 |
| 4,427,948 | 1/1984 | Rinaldi | 328/138 |
| 4,629,915 | 12/1986 | Suzuki et al. | 307/273 |

Primary Examiner—Stanley D. Miller
Assistant Examiner—Timothy P. Callahan
Attorney, Agent, or Firm—Richard Bushnell

[57] ABSTRACT

Input pulses are applied to toggle a first bistable whose output provide clock signals to a monostable timer whose period is set to the duration of one cycle of the input pulse a a critical frequency. A second bistable enables a third bistable and a counter only if an edge of a pulse from the timer occurs in an interval of the clock signals from the bistable. Thereafter the counter is clocked by pulses which are derived from the clock signals of the first bistable by the third bistable. The counter provides an indication after a predetermined number of the input pulses which have reached the critical frequency. An output signal derived from the indication may be maintained by a fourth bistable.

5 Claims, 2 Drawing Sheets

CIRCUIT ARRANGEMENT FOR DETECTING A CRITICAL FREQUENCY OF INPUT PULSES

It is known to provide a circuit for detection of a critical speed, usually a rotational speed, in an apparatus by arranging that a transducer in the apparatus generates a train of rectangular pulses whose frequency corresponds to the aforesaid speed. The circuit determines either the number of pulses occurring in a predetermined time, or the time taken to complete a predetermined number of pulses. An indication that the critical speed, for example an upper speed limit, has been reached is provided if the frequency of the input pulses attains a predetermined value.

It is a disadvantage of such known circuit arrangements that noise signals in the input pulse train may result in a spurious indication of the critical speed. It is an object of the present invention to provide a circuit arrangement in which a critical frequency of the input pulses must be sustained over a predetermined number thereof in order to provide an output signal indicative of said critical frequency.

According to the invention there is provided a circuit arrangement responsive to a train of input pulses for generating an output signal at a critical frequency of said pulses, comprising a circuit for generating a first clock signal at the edge of each recurring one of said pulses, a monostable circuit responsive to said first clock signals for generating pulses whose duration is equal to that of a predetermined number of cycles of said input pulses at said critical freqency, a circuit responsive to an edge of said timed pulses and to an interval in said first clock signals, for generating an enabling signal, and a counting circuit responsive to said enabling signal and to signals derived from said first clock signals, for generating a critical speed signal after a predetermined number of said first clock pulses.

Figure 2:
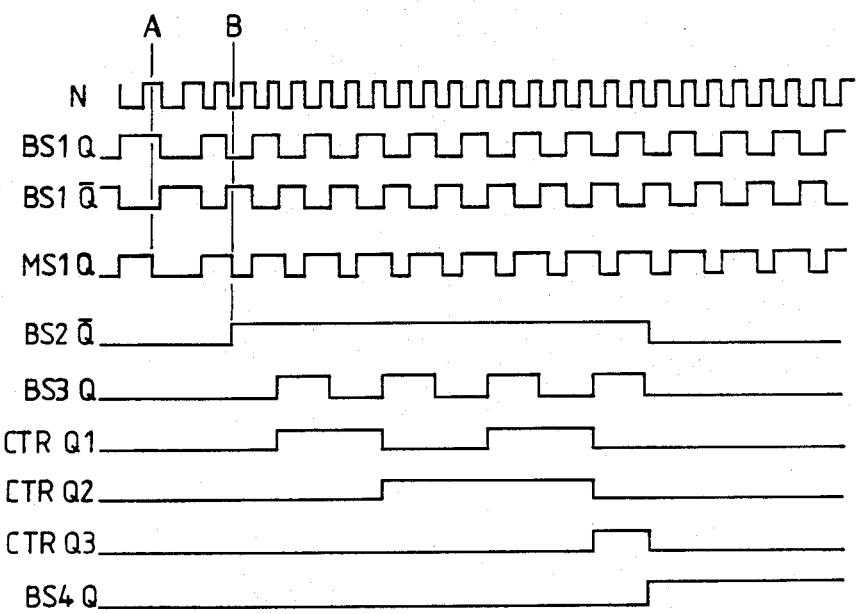
Figure 3:
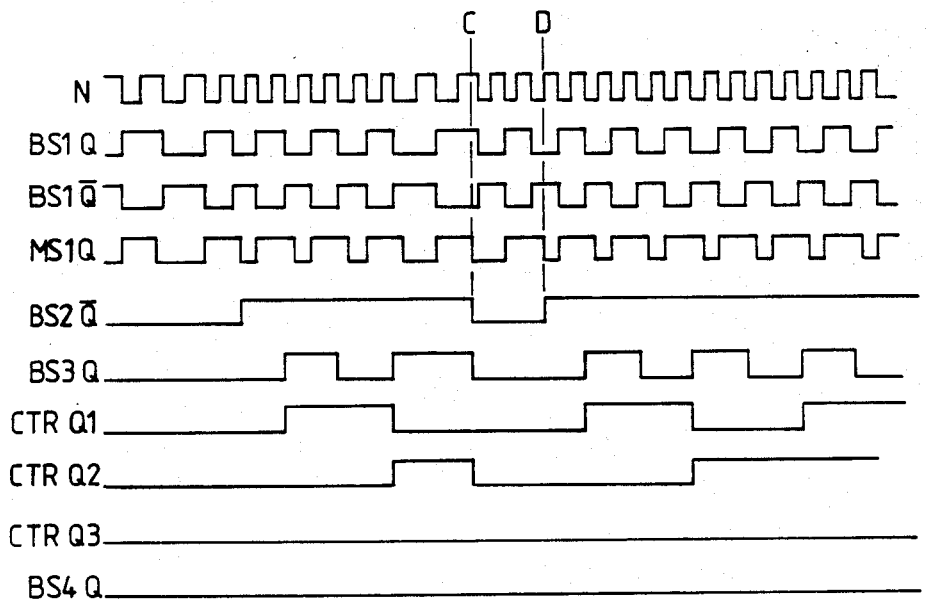

An embodiment of the invention will now be described by way of example only and with reference to the accompanying drawings in which:

FIG. 1 is a diagram of an overspeed detection system for a gas turbine engine, including a circuit arrangement according to the invention, FIG. 2 shows pulse signals at locations in FIG. 1 during an increase of input frequency past a critical value, and FIG. 3 shows pulse signals corresponding to FIG. 2 but additionally including a transient reduction below the critical value.

As shown in FIG. 1 a gas turbine engine 10 includes a magnetic detector 11 which is responsive to a plurality of equiangularly spaced elements on a spool 12 of the engine, to provide a train of substantially rectangular pulses N on a line 13, the frequency of the pulses N being porportional to the speed of the spool 12. The pulses N are supplied to a detection circuit arrangement 14 which provides an overspeed indicating signal on a line 15 if the frequency of the pulses N exceeds a predetermined datum value for a predetermined number of the pulses N.

The circuit arrangement 14 comprises three identical J-K bistables devices BS1, BS2, BS3, of the type available under the designation SN 54 LS 76, a monostable device MS1 of the type available under the designation SN 54 LS 122, and a counter CTR of the type available under the designation SN 54 LS 161.

The J and K terminals of device BS1 are both provided with logic 1 inputs. The Q terminal of device BS1 is connected to the clock terminals of devices MS1 and BS3, as well as to the J input of device BS2. The Q terminal of device MS1 is connected to the clock terminal of device BS2 and the J input of device BS3. The $\bar{Q}$ terminal of device BS1 is connected to the K input of device BS2 and the $\bar{Q}$ terminal of device BS2 is connected to the clear terminals of device BS3 and counter CTR. The Q terminal of device BS3 is connected to the clock terminals of counter CTR and device BS4. The Q3 terminal of counter CTR is connected to the J terminal of device BS4, whose Q terminal is connected to the line 15.

The clear terminals of devices BS1 and BS4 are connected to a line 16 to which a low level resetting signal for the arrangement 14 may be applied. The line 16 and the $\bar{Q}$ terminal of device BS4 are connected to an AND gate 17 whose output is connected to the preset terminal of device BS2.

In use, as shown in FIG. 2, the negative going edges of the input pulses N toggle the device BS1 so that its Q and $\bar{Q}$ outputs have half the frequency of the pulses N. The positive-going edges of the BS1 Q pulses act to clock the monostable device MS1, whose output period is adjusted to correspond to the duration of one cycle of the pulses N at the aforesaid predetermined datum frequency thereof. The negative-going edge of each pulse from the device MS1 clocks the device BS2. If the frequency of the pulses N is below the datum frequency the negative-going edge of the MS1 pulse occurs when BS1 Q output is high, as indicated at A in FIG. 2, in which case BS2 $\bar{Q}$ goes low. The device BS3 and counter CTR are held clear, there are no clock signals to counter CTR or the device BS4, and no J input signal to device BS4. No overspeed indicating signal is therefore provided on line 15.

If, however, the frequency of the pulses N is at or above the datum frequency, the negative-going edge of each MS1 pulse occurs when BS1 Q is low, as shown at B. The BS2 $\bar{Q}$ goes high and is so maintained while the overspeed condition exists or until reset by a low level output from the gate 17. With BS2 Q high the device BS3 and counter CTR are enabled and device BS3 is toggled at succeeding negative-going BS1 Q clock pulses, the resulting BS3 Q pulses causing the counter CTR to step. The negative-gong edge of the fourth BS3 Q pulse causes device BS4 to respond to the Q3 output of the counter CTR to provide an overspeed indicating signal on line 15.

Prior to the signal on line 15 both inputs to the gate 17 are logic 1, since the low level reset signal exists only at start-up. The signal on line 15 is accompanied by BS4 $\bar{Q}$ low level signal and the output from gate 17 resets BS2 $\bar{Q}$ to a low level, disenabling device BS3 and counter CTR to allow above operations to re-occur.

It will be seen that the signal on line 15 is generated only after 17 overspeed pulses N. If, after an overspeed count has started the frequency of the pulses N drops below the datum value, as indicated at C in FIG. 3, the next succeeding negative-going edge of MS1 Q, indicated at D, occurs when BS1 Q is high, whereupon BS2 $\bar{Q}$ goes low and the device BS3 and counter CTR are disenabled. The overspeed count stops but will restart from zero if the frequency of pulses N once again exceeds the datum value, as indicated at D.

The arrangement described thus gives an overspeed signal at the end of the time taken for a predetermined number of overspeed pulses, this number being set by the counter CTR. It will be apparent that this time may be set to any desired value which is longer than the expected duration of a transient noise signal. The response of the arrangement may thus be made as rapid as required consistent with suppression of transient noise.

The adjustment of the monostable MS1 may be altered to vary the critical speed at which a signal is generated on line 15. This alteration may be arranged to be automatic in response to variations in an operating condition, for example temperature, of the engine 10.

I claim:

1. A circuit arrangement responsive to a train of input pulses for generating a critical speed signal at a critical frequency of said pulses, comprising a circuit for generating first clock signals at one edge of each recurring ones of said pulses, a monostable circuit responsive to said first clock signals for generating timed pulses whose duration is equal to that of a predetermined number of said input pulses at said critical frequency, a circuit responsive to an edge of said timed pulses and to one level of said first clock signals for generating an enabling signal, a bistable circuit responsive to said enabling signal, to said first clock signals and to said timed pulses for generating second clock signals, and a counting circuit responsive to said enabling signal and to said second clock signals for generating a critical speed signal after a predetermined number of second clock signals.

2. An arrangement as claimed in claim 1 in which said circuits for generating said first clock signals and said enabling signal comprise first and second bistables respectively.

3. A circuit arrangement responsive to a train of input pulses for generating an critical speed signal at a critical frequency of said pulses, comprising a first bistable for generating first clock signals at one edge of each recurring ones of said pulses, a monostable circuit responsive to said first clock signals for generating timed pulses whose duration is equal to that of a predetermined number of said input pulses at said critical frequency, a second bistable responsive to an edge of said timed pulses and to one level of said first clock signals for generating an enabling signal, a third bistable responsive to said enabling signal, to said first clock pulses and to said timed pulses, for deriving second clock signals from said first clock signals, and a counting circuit responsive to said enabling signal and to said second clock signals for generating a critical speed signal after a predetermined number of said first clock signals.

4. An arrangement as claimed in claim 3 which includes a fourth bistable responsive to said critical speed signal and to said second clock signal for maintaining said critical speed signal.

5. An arrangement as claimed in claim 4 which includes means for clearing said first and fourth bistables and for presetting said second bistable, thereby to remove said enabling and to clear said third bistable and said counting circuit.

* * * * *